(12) United States Patent
Mason et al.

(10) Patent No.: US 9,347,976 B2
(45) Date of Patent: May 24, 2016

(54) HOT STICK POWER ANALYZER

(71) Applicant: Foster-Miller, Inc., Waltham, MA (US)

(72) Inventors: Timothy J. Mason, Uxbridge, MA (US);
David C. Meeker, Natick, MA (US);
James F. Godfrey, Holbrook, MA (US);
Jeffrey C. Travis, Brookline, MA (US);
William G. Leary, Natick, MA (US);
Alexander E. Post, Watertown, MA (US)

(73) Assignee: Foster-Miller, Inc., Waltham, MA (US)

( * ) Notice: Subject to any disclaimer, the term of this patent is extended or adjusted under 35 U.S.C. 154(b) by 115 days.

(21) Appl. No.: 14/061,128

(22) Filed: Oct. 23, 2013

(65) Prior Publication Data
US 2014/0125354 A1    May 8, 2014

Related U.S. Application Data

(60) Provisional application No. 61/722,417, filed on Nov. 5, 2012.

(51) Int. Cl.
| | |
|---|---|
| *G01R 21/02* | (2006.01) |
| *G01R 21/06* | (2006.01) |
| *G01R 35/00* | (2006.01) |
| *G01R 15/14* | (2006.01) |
| *G01R 19/25* | (2006.01) |

(52) U.S. Cl.
CPC .............. *G01R 21/06* (2013.01); *G01R 15/142* (2013.01); *G01R 35/005* (2013.01); *G01R 19/2513* (2013.01)

(58) Field of Classification Search
CPC ................................ G01R 15/04; G01R 15/14
USPC ............................. 324/126, 127, 117 R, 72.5
See application file for complete search history.

(56) References Cited

U.S. PATENT DOCUMENTS

| | | | | |
|---|---|---|---|---|
| 5,565,783 | A * | 10/1996 | Lau | G01R 15/142 324/127 |
| 6,555,999 | B1 * | 4/2003 | Lindsey et al. | 324/76.11 |
| 6,677,743 | B1 | 1/2004 | Coolidge et al. | |
| 2003/0169029 | A1 | 9/2003 | Piesinger | |
| 2006/0279910 | A1 * | 12/2006 | Gunn | G01R 1/22 361/600 |
| 2012/0139554 | A1 | 6/2012 | Parsons | |

OTHER PUBLICATIONS

Ross Engineering Corporation, Hi-Z® High Voltage AC Voltmeters, http://www.rossengineeringcorp.com/products/measurement/hi-z-hv-voltmeters.html, 2014, 1 pg.

(Continued)

*Primary Examiner* — Vincent Q Nguyen
(74) *Attorney, Agent, or Firm* — Iandiorio Teska & Coleman, LLP

(57) ABSTRACT

A hot stick power analyzer includes a housing mounted on a pole and a channel for a power line. A ground line extends from the housing and there is a power line conductive contact. A voltage sensor includes voltage sensing circuitry connected to the power line conductive contact and the ground line. There is a high voltage capacitance between the ground line and the voltage sensing circuitry. A current sensor includes windings about and spaced from the power line. A processing subsystem is responsive to the voltage sensing circuitry and to the current sensor and is configured to compute power analysis metrics.

18 Claims, 8 Drawing Sheets

(56) References Cited

OTHER PUBLICATIONS

HD Electric Company, Halo® Ammeter, Operating & Instruction Manual, http://www.hdelectriccompany.com/assets/files/halo_im.pdf, 2013, 8 pgs.

SensorLink® Corporation Qualstik XT Plus Live-Line Power Quality Meter, http://www.sensorlink.com/images/stories/Qualstik/PDFs/QualstikXT_Plus_Datasheet.pdf, 2011, 3 pgs.

Written Opinion of the International Searching Authority, mailed Apr. 3, 2014, in International Application No. PCT/US2013/066553, 7 pages (unnumbered).

* cited by examiner

HOT STICK POWER ANALYZER

RELATED APPLICATIONS

This application claims benefit of and priority to U.S. Provisional Application Ser. No. 61/722,417 filed Nov. 5, 2012 under 35 U.S.C. §§119, 120, 363, 365, and 37 C.F.R. §1.55 and §1.78 and is incorporated herein by this reference.

FIELD OF THE INVENTION

The invention relates to power line voltage and current measurement devices.

BACKGROUND OF THE INVENTION

Presently, three types of hot stick electrical measurement equipment are available for performing spot measurements. A hot stick voltmeter measures the voltage between a medium voltage (MV) line and ground, typically using a resistive voltage divider. A typical example is the instrument described at http://www.rossengineeringcorp.com/hi-z_hv_voltmeters.htm incorporated herein by this reference. The device connects to the line and has a connection to ground.

A hot stick ammeter measures the current flowing in a MV line, typically using an air-cored coil as the sensor. A typical example is the instrument described at http://www.hdelectriccompany.com/assets/files/halo_im.pdf incorporated herein by this reference. These devices typically have no connection to ground.

A hot stick power quality meter is essentially a hot stick ammeter augmented with a non-contact capacitive or fiber optic voltage gradient sensor that does not require a connection to ground. The voltage gradient sensor is not accurate enough to measure the voltage amplitude with accuracy, but it is claimed that voltage phasing information from the sensor can be used to accurately determine power factor and provide power quality information such as total harmonic distortion. A representative device is described at: http://tinyurl.com/qualstick incorporated herein by this reference.

These devices have several shortcomings including low accuracy of voltage measurements. Resistive voltage dividers are polluted by stray capacitance. In practice, no portable hot stick volt meters with accuracy better than 1% is available for purchase.

In contrast, long term/permanent Potential Transformer installations can obtain more accurate measurements at the expense of high costs of Potential Transformers and highly accurate metering equipment.

Since power quality meters like the one described above have no ground connection, they are susceptible to the influence of adjacent lines on voltage measurements. The influence of these adjacent lines can create phase/power factor errors.

Some systems require multiple instruments to get both current and absolute voltage reading. No known hot stick mounted device is presently available that allows for simultaneous, accurate current and voltage measurement.

To compute power, simultaneous and accurate measurements of voltage and current are required. Since existing portable devices do not simultaneously measure both quantities, measurement of power (and reactive power and phase angle) are precluded.

SUMMARY OF THE INVENTION

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

This invention describes a novel hot stick power analyzer. The device is mounted on the end of a "hot stick"—a fiberglass pole used by electrical workers for safely working on Medium Voltage (1 kV -35 kV) electric power distribution lines. The device is then momentarily applied to a power line. The device uses a capacitive voltage divider to measure voltage and an air-cored sense coil to measure current. An onboard computer samples each of these sensors and computes the various power analysis metrics. Accurate measurements of line-to-neutral voltage, line current, real power, reactive power, phase angle, and power factor are then wirelessly transmitted from the on-board computer to a nearby personal computer for display and/or storage.

The instrument can be used for spot measurements of voltage, current, phase angle, real power, reactive power, and other quantities related to power flow and power quality on a Medium Voltage (MV) electric power distribution line.

In addition to the device's general utility as a voltage, current, and power measurement instrument, the hot stick power analyzer has the needed capabilities to serve as a calibration tool for line-mounted MV sensors. These sensors have no physical ground connection and require highly accurate calibration of voltage and phase angle in their installation environment.

The hot stick power analyzer in one example of the invention comprises a combined current and voltage sensor mounted on a hot stick, a USB radio modem that can be attached to a laptop PC, and software on the PC that stores/displays the measurement results and/or transfers the readings to an MV collector for calibration of ungrounded MV sensors.

Featured is a power analyzer system and method. The system includes a hot stick power analyzer with a housing mounted on a pole and including a channel for a power line. A ground line extends from the housing. A voltage sensor includes voltage sensing circuitry connected to a power line conductive contact and the ground line. A high voltage capacitance is between the ground line and the voltage sensing circuitry. A current sensor includes windings about and spaced from the power line. A processing subsystem is responsive to the voltage sensing circuitry and the current sensor and is configured to compute power analysis metrics.

Preferably, a housing stem unit has the ground wire therein forming one electrode of the high voltage capacitance. An insulator is about the ground wire and a conductor about the insulator forms the other electrode of the high voltage capacitance coupled to the voltage sensing circuitry. Also, the housing stem unit may further include an insulator about the conductor and a case about the insulator forming a second capacitance connected between the power line conductive contact and the voltage sensing circuitry. Preferably, the processing subsystem is within the housing.

In one version, the power line conductive contact includes a portion of the housing which is wired to the voltage sensing circuitry. The analyzer may further include a transmitter controlled by the processing subsystem for wirelessly sending the computed power analysis metrics to a computer.

In one example, the system may also include a line mounted sensor calibrated by the computed power analysis metrics. In one example, the power analysis metrics include RMS voltage, RMS current, real power, reactive power, a power factor, a phase angle, total harmonic distortion, instantaneous voltage waveforms, and/or instantaneous current waveforms.

In one example, a hot stick power analyzer comprises a pole and a housing mounted on the pole and including a ground line and a power line conductive contact. A voltage sensing circuit in the housing is connected to the ground line and the conductive contact. There is a high voltage capacitor between the ground line and the voltage sensing circuit. A current sensor including windings is inside the housing spaced from the power line.

Also featured is a method of calibrating the output of a non-grounded power line mounted sensor. One preferred method includes using a hot stick meter to connect the power line to a voltage sensing circuit grounded via a high voltage capacitance and to sense current in the power line using current sensor windings spaced from the power line. Power analysis metrics are computed from a voltage level sensed by the voltage sensing circuit and a current level sensed by the current sensor. The computed power analysis metrics are used to calibrate the output of the non-grounded power line mounted sensor. In one example, the computed power analysis metrics are wirelessly transmitted from the hot stick meter to a computer and the power analysis metrics are further wirelessly transmitted from the computer to a collector in wireless communication with the non-grounded line mounted sensor.

The subject invention, however, in other embodiments, need not achieve all these objectives and the claims hereof should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

The hot stick-mounted sensor device is typically a small housing mounted on the end of a "hot stick" pole. A high voltage capacitor is used to sense the voltage on the distribution line. One end of the capacitor is connected to the input of a voltage sensing circuit. A cable on the other end of the capacitor makes a connection to ground. An air-cored coil, also known as a "Rogowski coil", senses the current flowing in the distribution line. The coil creates a voltage proportional to the time derivative of current in the line without loading the line in a significant way.

A low-power microcontroller can be used to rapidly (~8000 times per second) sample the voltage and current test circuits and compute associated quantities like RMS voltage, RMS current, real power, and reactive power.

A wireless transceiver transmits measurements via radio to a modem attached to a laptop. Because the microcontroller is at high voltage, it can be dangerous to have a direct cable connection. A wireless connection to a laptop computer speeds the reading of data, increases accuracy, and eliminates the chance for errors in manually transposing measurements from a display or dial on the device to a storage media.

Battery and Voltage Regulator as an on-board power supply is used to drive the measurement circuits, microcontroller, and transceiver. The USB radio modem is essentially the same low power microcontroller and wireless transceiver used in the hot stick sensor itself, but connected to a USB port for interface with a laptop computer.

The present version of the software, implementing the general power analyzer has several functions: Manage low-level communications with the sensor via the USB Modem and generate web pages that display instantaneous readings of RMS voltage, RMS current, real power, reactive power, power factor, phase angle, and total harmonic distortion. The software may also compute and display instantaneous voltage and current waveforms and historical plots of all quantities noted above. The software may also maintain a database that stores readings for later historical display.

In addition, to implement the MV sensor calibration scenario, the software will manage communications with the MV collector via Wi-Fi, automatically conveying the voltage and phase angle information needed for calibration with a minimum of user interaction.

Features include simultaneous measurement of voltage and amperage in a portable, hot stick-mounted sensor; measurement of power in a portable, hot stick-mounted sensor; capacitive voltage divider employed for accurate voltage measurements in a portable sensor; measurement of voltage and phase angle necessary for calibration of ungrounded power line sensors, typified by the sensor described in U.S. Pat. No. 6,677,743; and automatic calibration of ungrounded power line sensors.

Figure 1:
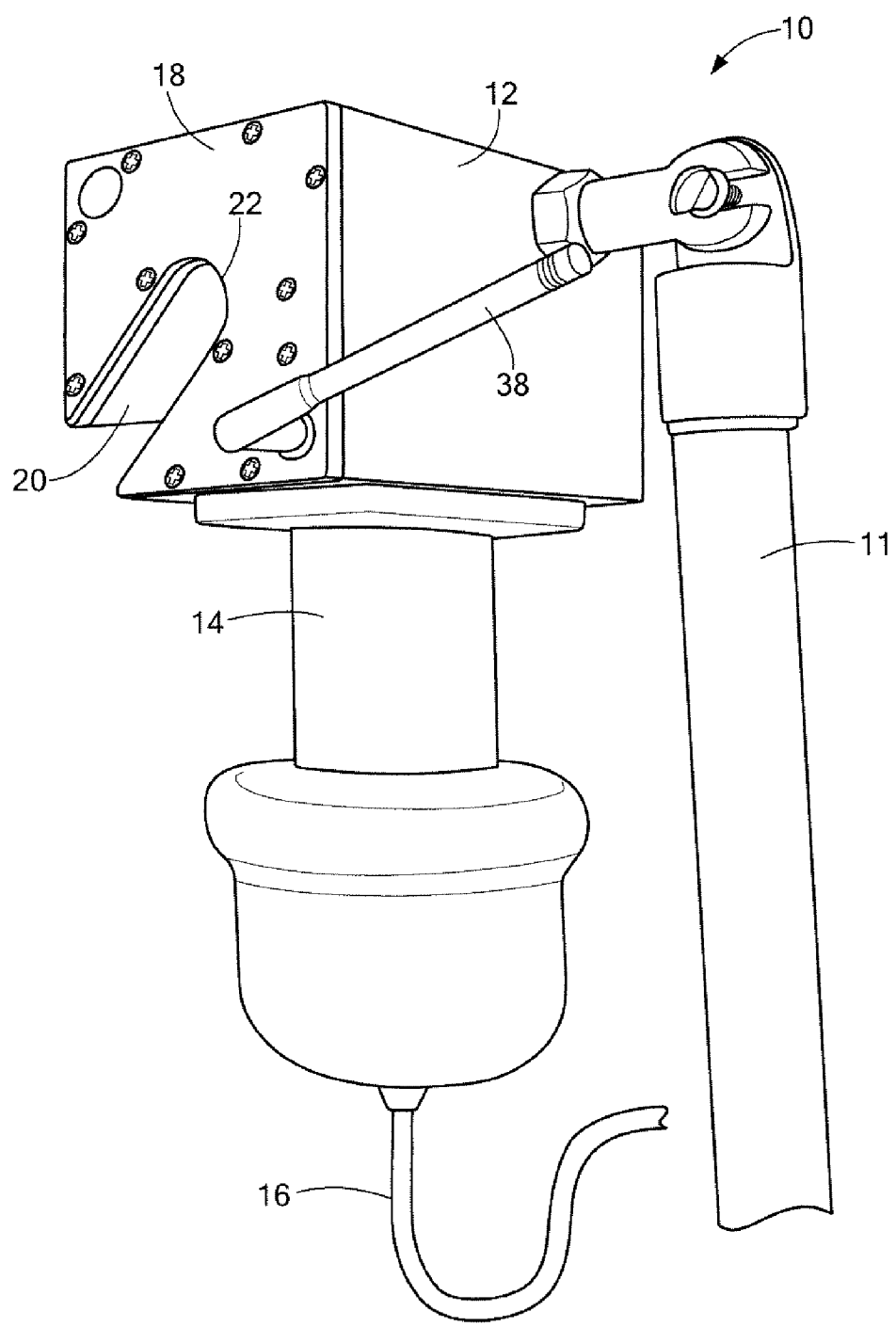
FIG. 1 is a schematic view showing an example of a hot stick power analyzer in accordance with the invention.

FIG. 1 shows an example of hot stick power analyzer 10 with fiberglass pole 11 coupled to meter housing 12 fitted with a stem unit 14 including the high voltage capacitor for the voltage sensing circuitry of the unit.

Ground wire 16 is shown exiting from the stem unit and housing 12 has one or more conductive (e.g., metal) end plates 18 which contact the medium voltage power line under analysis for voltage sensing. For example, here the housing has channel 20 used to position the housing 12 on the power line which contacts U-shaped portion 22 of end plate 18 which is connected via a wire 23, FIG. 2, to the voltage sensing circuitry located inside the housing. If a plastic or other insulative housing is used, a power line conductive contact can be added to the housing in other ways.

Figure 2:
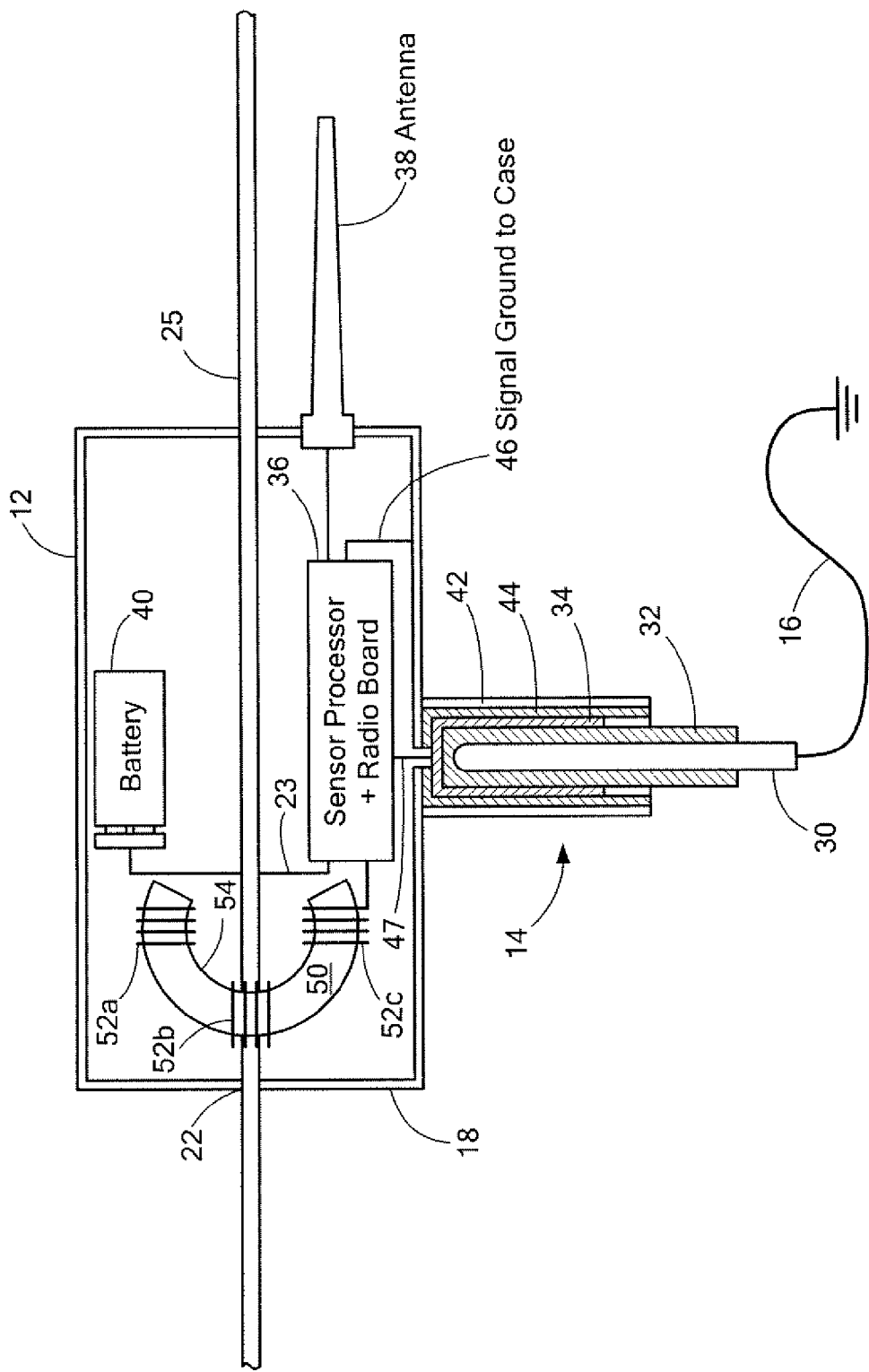
FIG. 2 is a block diagram showing the primary components associated with analyzer of FIG. 1.

FIG. 2 shows housing case contact 22 touching medium voltage transmission line 25. Case housing 22 or its end plate is wired to printed circuit board 36 as shown at 46 and the printed circuit board includes the voltage sensing circuitry, current sensing circuitry, a processor, a transmitter, and the like.

Stem 14 forms in this example two capacitors. The high voltage capacitor between ground and the voltage sensing circuitry includes a ground conductor 30 connected to ground wire 16 forming one electrode of the high voltage capacitor (5 pF), $C_O$ in FIGS. 3-4. An insulative sleeve such as a Teflon rod 32 surrounds ground conductor 30. A sensor conductor 34 (e.g., copper foil) surrounds insulator 32 and forms the other electrode of the high voltage capacitor $C_O$, FIGS. 3-4, connected to the voltage sensing circuitry on printed circuit board 36 inside housing 12 as shown at 47. Printed circuit board 36 may also include a processing sensing subsystem such as a microcontroller or microprocessor, various signal conditioning circuitry, and/or a transmitter connected to antenna 38 as discussed below.

A power source such as battery 40 may also provide power to the circuits and components of printed circuit board 36. Stem 14 may further include a second capacitor (e.g., 500 pF), $C_I$ in FIGS. 3-4, with conductor 36 forming one electrode thereof and stem case 42 forming the other electrode thereof connected to printed circuit board 36 via housing 12 and wire 46 as shown. An insulator 44 such as a vinyl sheet spaces case 42 from conductor 34.

Figure 4:
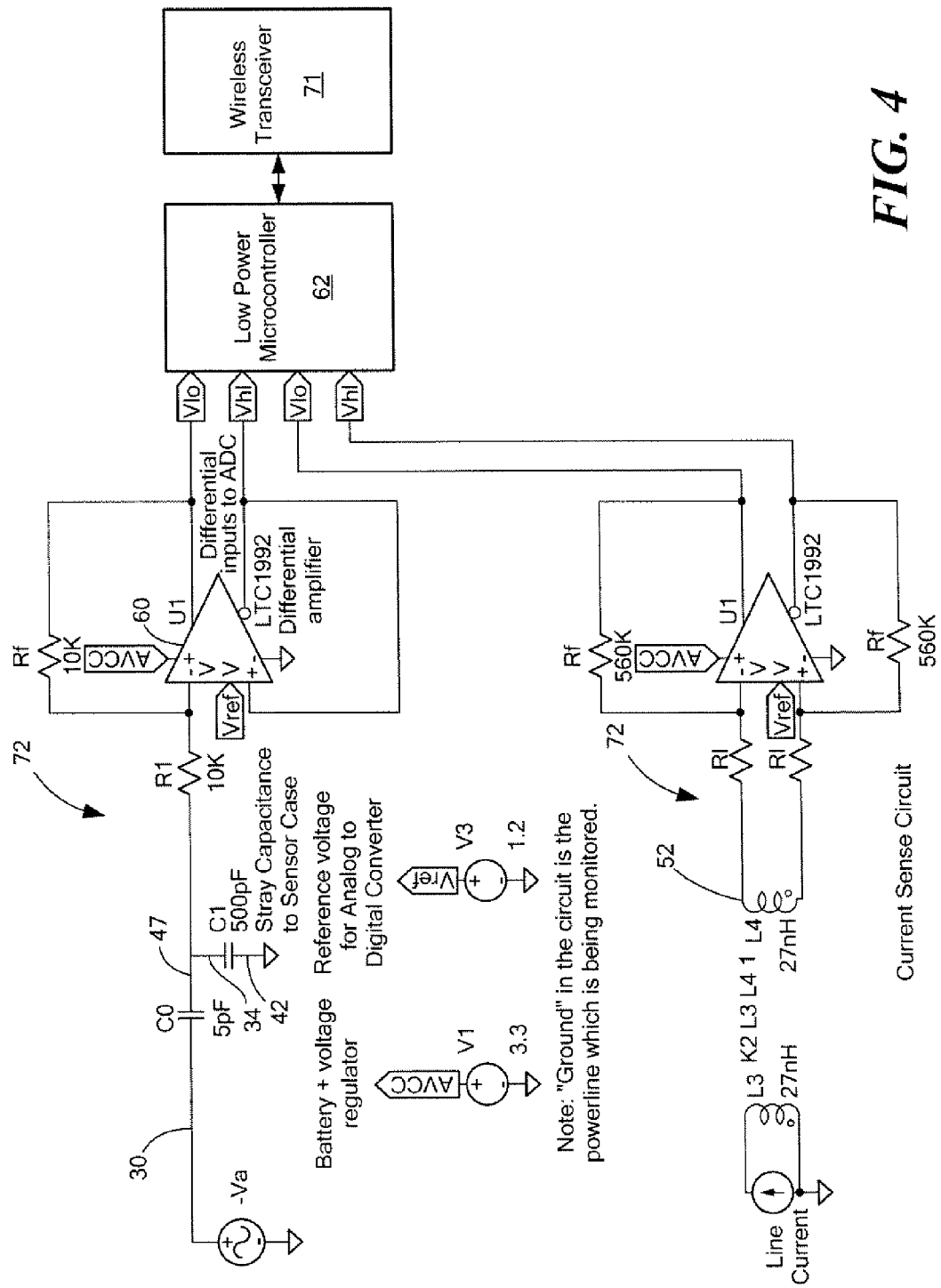
FIG. 4 is a circuit diagram showing another representation of the voltage sensing and current sensing circuitry of the analyzer.

Also shown in FIGS. 2 and 4 is a current sensor 50 with windings 52a, 52b, and 52c about C-shaped structure 54 connected together and to the current sensing circuitry of printed circuit board 36. The windings are configured to be disposed about power line 25 and spaced therefrom so the power line induces a voltage in the windings which is proportional to the current flowing in the power line. Such an air cored Rogowski coil is thus preferably used to sense power line current. In FIG. 4, the windings of the current sensor are shown at 52.

Figure 3:
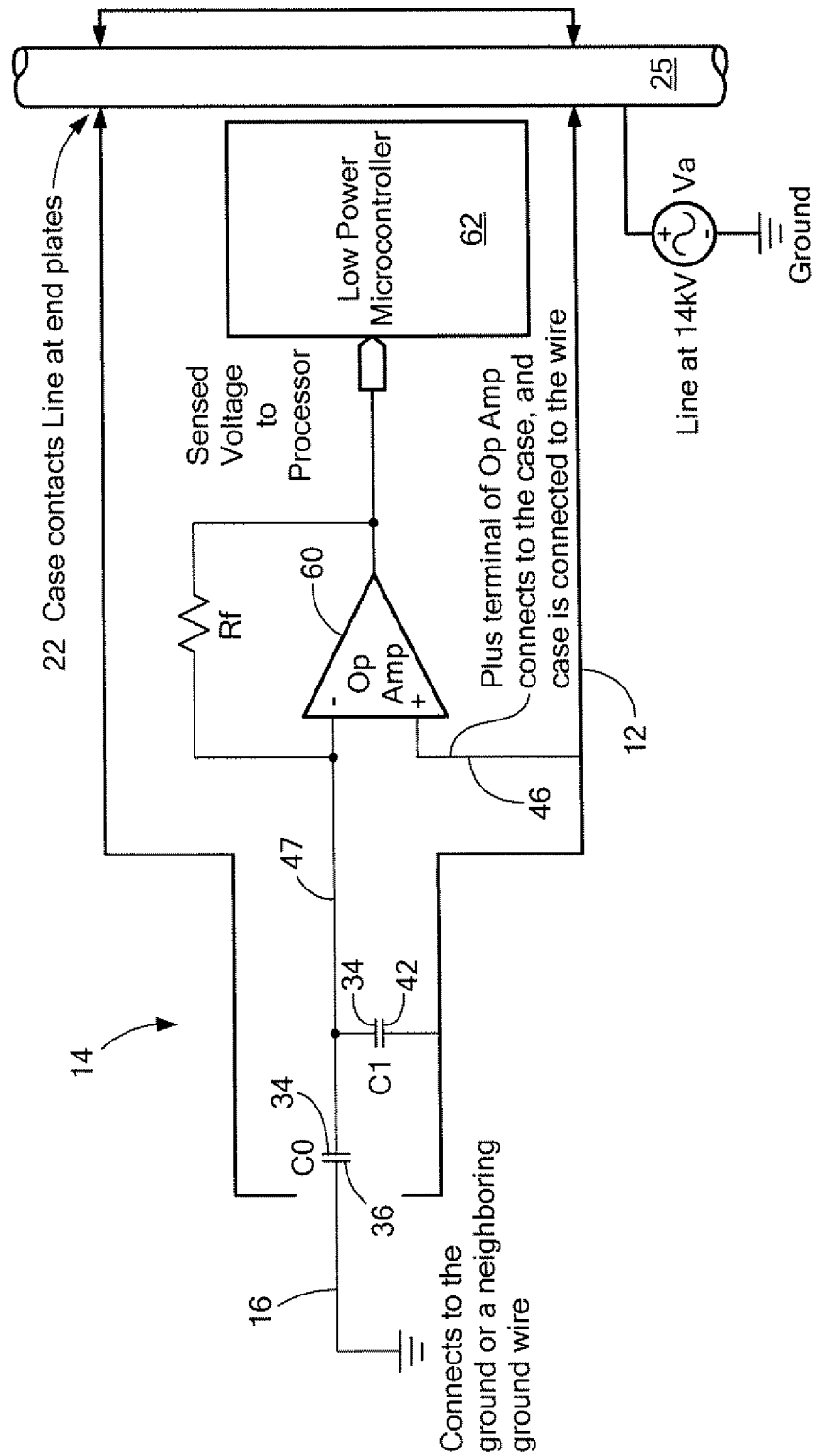
FIG. 3 is a diagram showing the voltage sensing circuitry of the analyzer.

In FIG. 3, the voltage sensing circuitry includes OP amp 60 having its negative terminal connected to high voltage capacitor $C_O$ and its positive terminal connected to power line conductive contact 22 here via housing 12. The output of OP amp 60 is directed to a processing subsystem shown here as a microcontroller. The microcontroller is programmed with computer instructions which compute power analysis metrics from the voltage sensed by the voltage sensing circuitry. Resister Rf may be coupled between the input of OP amp 60 and its output. FIG. 4 shows another representation of the voltage sensing circuitry as well as the current sensor where the "ground" is represented as the power line being monitored. FIG. 4 also shows additional details showing concerning voltage sensing circuitry 70 and current sensing circuitry 72, in one example. The wireless transceiver 71 is also shown.

Figure 5:
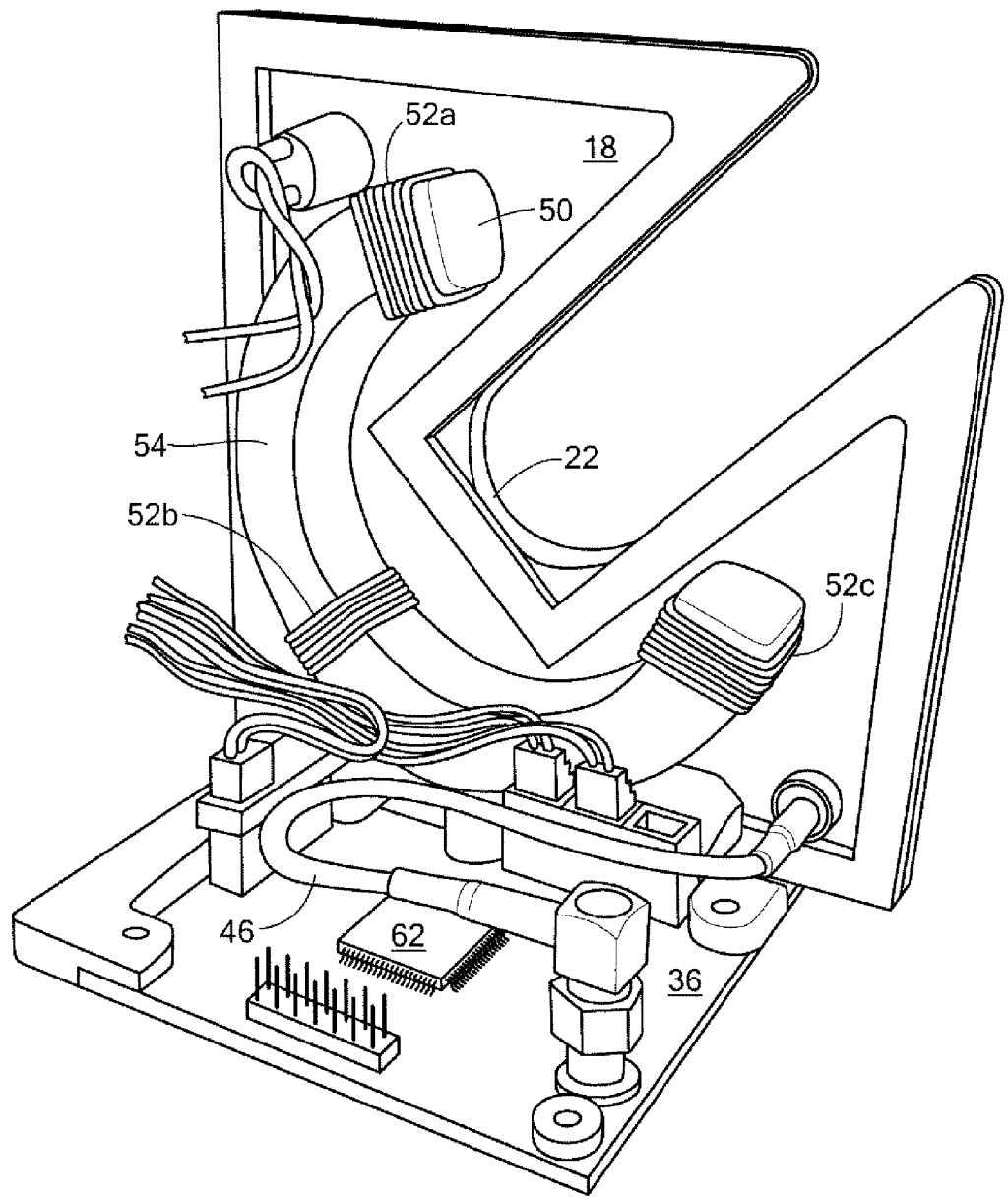
FIG. 5 is a schematic view showing the inside of the analyzer housing depicted in FIG. 1.
Figure 6:
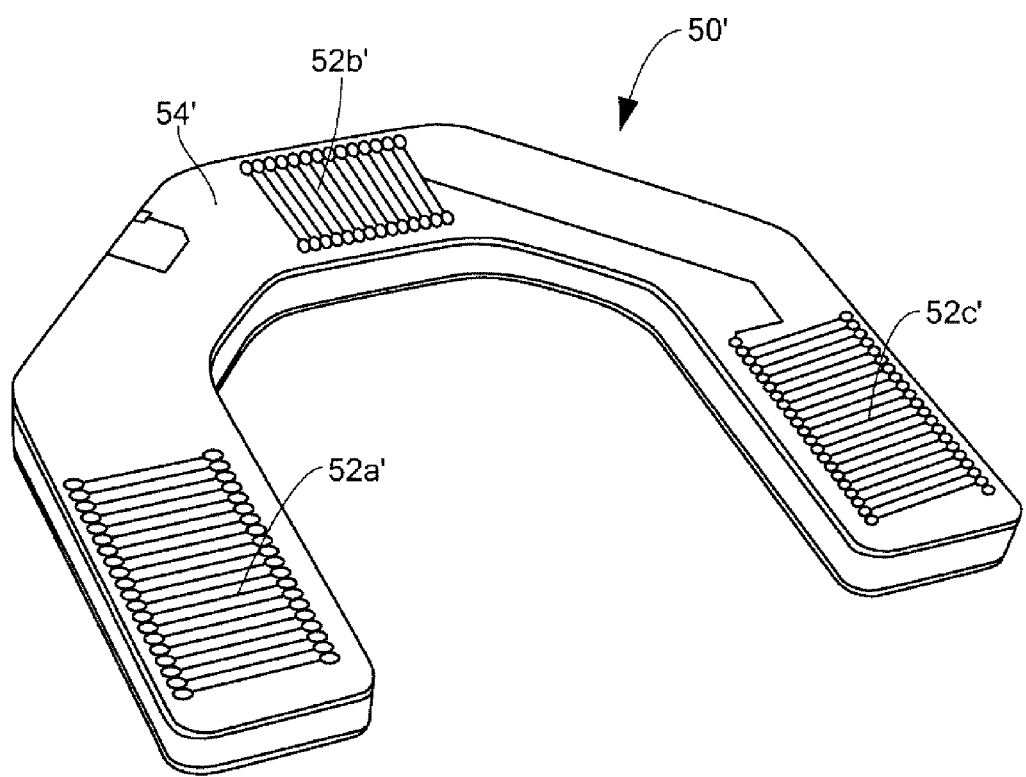
FIG. 6 is a schematic view showing another version of a current sensor apparatus for the analyzer of the invention in some examples.

FIG. 5 shows end plate 18 removed revealing printed circuit board 36 and current sense coil structure 50 with windings 52a-52c about plastic C-shaped module 54 disposing the windings about the power line. FIG. 6 shows another possible coil structure 50' with windings 52a-52c in C-shaped printed circuit board module 54'.

Figure 7:
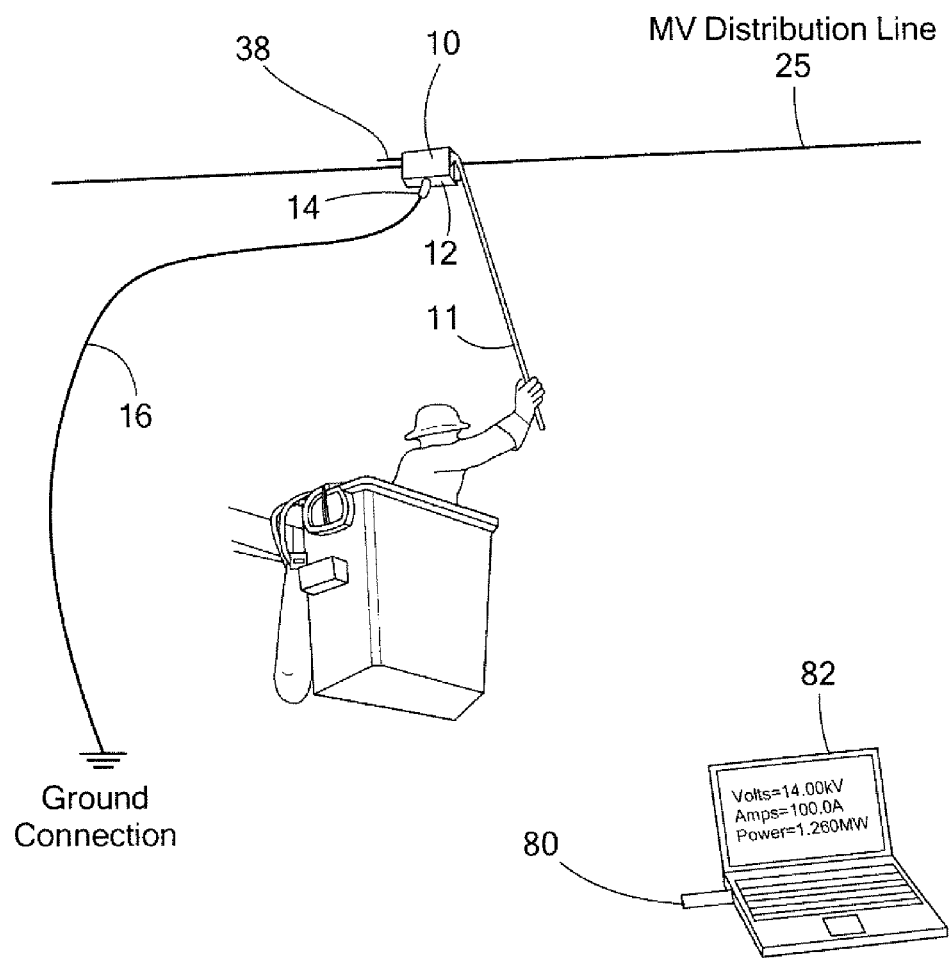
FIG. 7 is a schematic view showing deployment of the analyzer of FIG. 1 about a medium voltage power line.

In FIG. 7, a lineman places the hot stick-mounted sensor 10 on the line using pole 11. The hot stick-mounted sensor measures current, voltage, and real and reactive power. It then wirelessly transmits this information to a nearby laptop PC 82, using a USB radio modem 80 to receive the signals from the sensor. Software on the PC then displays measurements of current, energy, power, etc.

Figure 8:
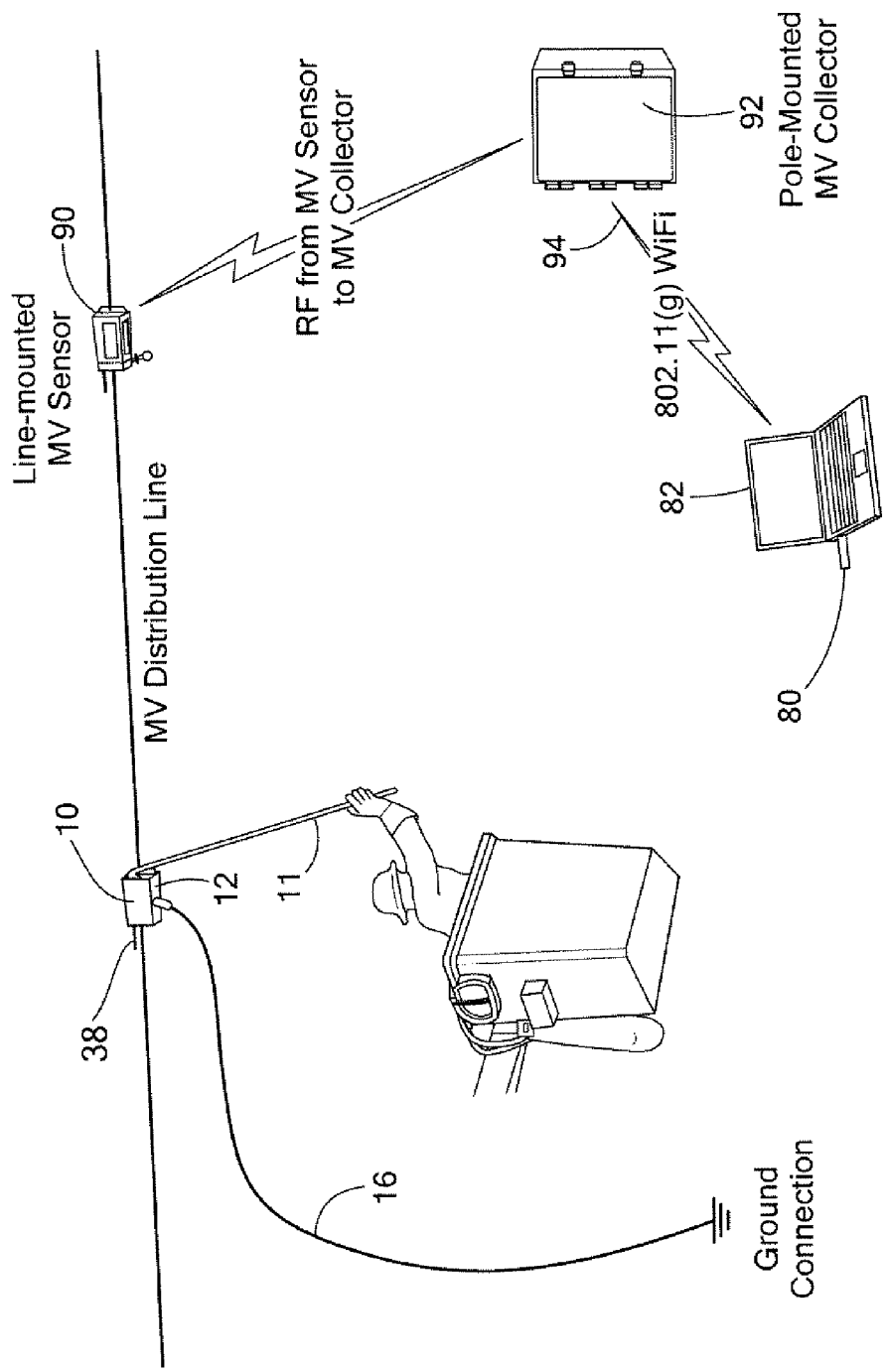
FIG. 8 is a schematic view showing deployment of the power analyzer of FIG. 1 about a medium voltage power line in order to calibrate a line mounted sensor.

The second scenario of FIG. 8 is similar, except that the PC 82 not only wirelessly communicates with analyzer 10, but also with a MV collector box 92 that receives measurements from permanent, line-mounted medium voltage sensor(s) 90.

Sensors are of the type described in U.S. Pat. No. 6,677,743, incorporated herein by this reference. A capacitive coupling from plates on the exterior of the sensor to ground is used to sense voltage. The gain and phase shift of the sensors must be accurately calibrated as part of the sensors' installation procedure. PC 82 serves as a conduit for measurements, automating the calibration of the sensors via measurements with the hot stick power analyzer.

Housing 12, FIG. 7 is disposed over medium voltage line 25 using pole 11. The processing subsystem of the power analyzer (and/or PC 82) computes power analysis metrics such as RMS voltage, RMS current, real power and the like discussed above. The transmitter wirelessly transmit these metrics to a radio modem 80 attached to a USB port of laptop computer 82 for record keeping, further processing, or the like. Processing may be distributed, in some examples, between laptop 82 and power analyzer 10. FIG. 8 shows how power analyzer 10 can be used to calibrate a power line mounted sensor 90 wirelessly providing signals to collection unit 92. Here, communication between computer 82 and collector 92 are preferably via Wi-Fi signals as shown at 94.

Power line mounted sensor 90 (see, e.g., U.S. Pat. No. 6,677,743 incorporated herein by this reference) is advantageous because it is a stand alone unit but disadvantageous because it is ungrounded and may provide inaccurate readings. For example, since such sensors have no ground connection, they may be susceptible to the influence of adjacent lines when taking voltage measurements. The influence of these adjacent power lines can create phase/power factor errors.

But, by using the more accurately computed power analysis metrics output by the power analyzer of the subject invention which is grounded, line mounted sensor 90 and/or collector 92 can be calibrated at installation calibrate the voltage gain of the sensor and to correct or adjust phase/power factor errors.

In one particular example, calibration constants are transmitted wirelessly from computer 82 to collector 92 to adjust the raw measurements output by sensor 90 to collector 92 to more accurately reflect the RMS voltage, RMS current, and other readings taken by sensor 90.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

What is claimed:
1. A power analyzer system comprising:
a housing mounted on a pole and including a channel for a power line;
a ground line extending from the housing;
a power line conductive contact;
a voltage sensor including voltage sensing circuitry connected to the power line conductive contact and the ground line;
a high voltage capacitance between the ground line and the voltage sensing circuitry;
a current sensor including windings about and spaced from the power line; and
a processing subsystem responsive to the voltage sensing circuitry and the current sensor and configured to compute power analysis metrics.

2. The system of claim 1 further including a housing stem unit with the ground wire therein forming one electrode of the high voltage capacitance, an insulator about the ground wire, and a conductor about the insulator forming the other electrode of the high voltage capacitance coupled to the voltage sensing circuitry.

3. The system of claim 2 in which the housing stem unit further includes an insulator about the conductor and a case about said insulator forming a second capacitance connected between the power line conductive contact and the voltage sensing circuitry.

4. The system of claim 1 in which the processing subsystem is within the housing.

5. The system of claim 4 further including a transmitter controlled by the processing subsystem for wirelessly sending said computed power analysis metrics to a computer.

6. The system of claim 1 in which the power line conductive contact includes a portion of the housing which is wired to the voltage sensing circuitry.

7. The system of claim 6 further including a line mounted sensor calibrated by the computed power analysis metrics.

8. The system of claim 1 in which said power analysis metrics include RMS voltage, RMS current, real power, reactive power, a power factor, a phase angle, total harmonic distortion, instantaneous voltage waveforms, and/or instantaneous current waveforms.

9. A hot stick power analyzer comprising:
   a pole;
   a housing mounted on the pole and including a ground line and a power line conductive contact;
   a voltage sensing circuit in the housing connected to the ground line and the conductive contact;
   a high voltage capacitor between the ground line and the voltage sensing circuit; and
   a current sensor including windings inside the housing spaced from the power line.

10. The analyzer of claim 9 in which the housing includes a channel for the power line.

11. The analyzer of claim 10 further including a transmitter controlled by the processing subsystem for wirelessly sending said computed power analysis metrics to a computer.

12. The analyzer of claim 9 in which the housing further includes a processing subsystem in the housing responsive to the voltage sensing circuit and the current sensor and configured to compute power analysis metrics.

13. The analyzer of claim 9 further including a stem mounted to the housing with the high voltage capacitor therein.

14. The analyzer of claim 13 in which the ground wire terminates in the stem forming one electrode of the high voltage capacitor, and further including an insulator about the ground wire and a conductor about the insulator forming the other electrode of the high voltage capacitor coupled to the voltage sensing circuit.

15. The analyzer of claim 14 in which the stem unit further includes an insulator about the conductor and a case about said insulator forming a second capacitor connected between the power line conductive contact and the voltage sensing circuit.

16. A method of calibrating the output of a non-grounded power line mounted sensor, the method comprising:
   using a hot stick meter to connect to a voltage sensing circuit connected to a power line conductive contact and a ground line and a high voltage capacitance coupled between the ground line and the voltage sensing circuit and to sense current in the power line using current sensor windings spaced from the power line;
   computing power analysis metrics from a voltage level sensed by the voltage sensing circuit and a current level sensed by the current sensor; and
   using said computed power analysis metrics to calibrate the output of the non-grounded power line mounted sensor.

17. The method of claim 16 in which the computed power analysis metrics are wirelessly transmitted from the hot stick meter to a computer.

18. The method of claim 17 in which said power analysis metrics are further wirelessly transmitted from the computer to a collector in wireless communication with the non-grounded line mounted sensor.

* * * * *